(12) United States Patent
Sayilir et al.

(10) Patent No.: US 10,008,987 B1
(45) Date of Patent: Jun. 26, 2018

(54) SWITCH AND MATCHING NOISE CANCELLING FOR SWITCH LOW NOISE AMPLIFIER

(71) Applicant: QUALCOMM Incorporated, San Diego, CA (US)

(72) Inventors: Serkan Sayilir, San Diego, CA (US); Chuan Wang, San Diego, CA (US); Li-chung Chang, Irvine, CA (US); Kevin Hsi Huai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/583,944

(22) Filed: May 1, 2017

Related U.S. Application Data (60) Provisional application No. 62/435,653, filed on Dec. 16, 2016.

(51) Int. Cl.
| | |
|---|---|
| *H03F 1/26* | (2006.01) |
| *H03F 1/56* | (2006.01) |
| *H03F 3/193* | (2006.01) |
| *H03F 3/21* | (2006.01) |

(52) U.S. Cl.
CPC ............ *H03F 1/26* (2013.01); *H03F 1/56* (2013.01); *H03F 3/193* (2013.01); *H03F 3/21* (2013.01); *H03F 2200/222* (2013.01); *H03F 2200/294* (2013.01); *H03F 2200/451* (2013.01)

(58) Field of Classification Search
USPC ........... 330/295, 124 R, 84, 286, 53–54, 151
See application file for complete search history.

(56) References Cited

U.S. PATENT DOCUMENTS

| | | |
|---|---|---|
| 6,262,629 B1 | 7/2001 | Stengel et al. |
| 6,414,550 B1 | 7/2002 | Forbes |
| 6,781,467 B2 | 8/2004 | Sun |
| 7,876,160 B2 | 1/2011 | Zhang et al. |
| 8,138,835 B2 * | 3/2012 | Zeng ............... H03F 1/0205 330/149 |
| 9,298,198 B2 | 3/2016 | Kay et al. |
| 9,859,930 B2 * | 1/2018 | Lu ..................... H04B 1/12 |

* cited by examiner

*Primary Examiner* — Hieu Nguyen
(74) *Attorney, Agent, or Firm* — Qualcomm Incorporated/Seyfarth Shaw LLP (57) ABSTRACT

A low noise amplifier (LNA) reduces matching and switch noise. The LNA includes a main radio frequency signal path, an auxiliary radio frequency signal path and a phase shifter. The main path includes a first transistor and an inductor. The inductor is positioned between an input port of the LNA and the first transistor. The first transistor receives an input radio frequency signal via the inductor and provides a first amplified signal based on the input radio frequency signal. The auxiliary radio frequency signal path provides a second amplified signal for a noise cancellation mode based on the input radio frequency signal. The phase shifter applies a phase shift to an output signal of the LNA based on the first amplified signal and the second amplified signal.

23 Claims, 9 Drawing Sheets

SWITCH AND MATCHING NOISE CANCELLING FOR SWITCH LOW NOISE AMPLIFIER

CROSS-REFERENCE TO RELATED APPLICATION

The present application claims the benefit of U.S. Provisional Patent Application No. 62/435,653, filed on Dec. 16, 2016, and titled "SWITCH AND MATCHING NOISE CANCELLING FOR SWITCH LOW NOISE AMPLIFIER," the disclosure of which is expressly incorporated by reference herein in its entirety.

TECHNICAL FIELD

The present disclosure generally relates to low noise amplifiers. More specifically, aspects of the present disclosure relate to switch and matching noise cancelling for switch low noise amplifiers.

BACKGROUND

Amplifiers are commonly used in various electronic devices to provide signal amplification. Different types of amplifiers are available for different uses. For example, a wireless communication device such as a cellular phone may include a transmitter and a receiver for bi-directional communication. The receiver may utilize a low noise amplifier (LNA), the transmitter may utilize a power amplifier (PA), and the receiver and transmitter may utilize variable gain amplifiers (VGAs).

A receiver may include an LNA coupled to an antenna via various front-end circuit blocks. These circuit blocks may perform functions such as filtering, switching between the transmitter and the receiver, impedance matching, etc. These circuit blocks may be implemented with discrete components external to an integrated circuit (IC) containing the LNA. The external, or off chip, components increase the cost and size of the receiver. Each of these circuit blocks may also have insertion loss, which degrades the noise figure (NF) of the receiver and hence degrades the performance of the receiver.

SUMMARY

In an aspect of the present disclosure, a low noise amplifier (LNA) includes a main radio frequency signal path, an auxiliary radio frequency signal path and a phase shifter. The main radio frequency signal path includes a first transistor and an inductor. The inductor is positioned between an input port of the LNA and the first transistor. The first transistor receives an input radio frequency signal via the inductor and provides a first amplified signal based on the input radio frequency signal. The auxiliary radio frequency signal path provides a second amplified signal for a noise cancellation mode based on the input radio frequency signal. The phase shifter applies a phase shift to an output signal of the LNA based on the first amplified signal and the second amplified signal.

In another aspect of the present disclosure, a low noise amplifier includes a main radio frequency signal path, an auxiliary radio frequency signal path and a phase shifter. The main radio frequency signal path includes a first means for performing signal amplification and an inductor. The inductor is positioned between an input port of the LNA and the first signal amplification means. The first signal amplification means receives an input radio frequency signal via the inductor and provides a first amplified signal based on the input radio frequency signal. The auxiliary radio frequency signal path provides a second amplified signal for a noise cancellation mode based on the input radio frequency signal. The phase shifter applies a phase shift to an output signal of the LNA based on the first amplified signal and the second amplified signal.

In yet another aspect of the present disclosure, a method for performing signal amplification in a low noise amplifier includes amplifying an input radio frequency signal received at a first transistor via an input port and an inductor of the low noise amplifier to obtain a first amplified signal. The method also includes amplifying the input radio frequency signal received at a second transistor via the input port to obtain a second amplified signal for a noise cancellation mode. The method further includes generating an output signal of the low noise amplifier based on the first amplified signal and the second amplified signal. Furthermore, the method includes applying a phase shift to the output signal.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR" and the use of the term "or" is intended to represent an "exclusive OR".

Aspects of the present disclosure are directed to reducing matching and switch noise for a switch low noise amplifier (LNA) design. The LNA amplifies an input radio frequency signal and provides an output signal (e.g., an output current signal). In a receive chain of a radio frequency front end (RFFE), the LNA uses one or more off-chip high quality (high-Q) components (e.g., high-Q inductor) for better noise figure (NF). Also included in the receive chain are switches for band selection. The multiple switches and the inductor may be external to the LNA. Noise of the inductor and the switches dominate the noise figure associated with the LNA. Solutions for mitigating noise associated with the inductor and the switches generally increase cost of the radio frequency front end module, increase the module area, and limit design of the LNA to a subset of processes.

Aspects of the present disclosure are directed to reducing matching and switch noise for a switch LNA design while mitigating cost, area, and process concerns. In one aspect of the disclosure, the LNA may be implemented with an on-chip inductor and on-chip switches. The on-chip inductor is used instead of an off-chip inductor or matching component. The on-chip inductor reduces a size of a receiver module on which the LNA is incorporated by eliminating at least some of the large off-chip passive matching components. Accordingly, an area and cost of a radio frequency front-end module (including the transceiver) are reduced. The input matching becomes wider (with respect to frequency) because of the on-chip low Q-factor matching component (e.g., inductor).

Aspects of the present disclosure also reduce switch noise. Because of the reduction in switch noise, process selection for the LNA becomes more flexible. For example, in addition to silicon on insulator (SOI) technology for better switch performance, other process technologies may be used. Although conventional on-chip inductors have a low quality (Q)-factor (e.g., Q~10), the on-chip inductor implementation of this disclosure achieves an increased effective quality factor.

In one aspect of the present disclosure, a low noise amplifier (LNA) includes a main radio frequency signal path and an auxiliary radio frequency signal path. The main radio frequency signal path includes a first transistor and an on-chip inductor between an input port and the first transistor of the LNA. In some aspects, the main radio frequency signal path may also include a switch. The first transistor receives an input radio frequency signal via the on-chip inductor and/or the switch and provides an amplified signal based on the received input radio frequency signal. The auxiliary radio frequency signal path includes a second transistor to receive the input radio frequency signal from the input port and to provide a second amplified signal based on the input radio frequency signal for a noise cancellation mode. An output signal of the LNA is based on the first amplified signal and the second amplified signal.

A phase shifter applies a phase shift (e.g., negative ninety degree phase shift) to the output signal. The application of the negative ninety degree phase shift is based on an application of a first phase shift and a second phase shift to the first amplified signal and the second amplified signal, respectively. A difference of the first phase shift and the second phase shift substantially equals the negative ninety degree phase shift. In some configurations, the first phase shift may be equal (e.g., −45 degrees) to the second phase shift (e.g., 45 degrees). In other configurations, the first phase shift (e.g., 0 degrees or −90 degrees) may be different from the second phase shift (90 degrees or 0 degrees). The second transistor may be enabled in accordance with the noise cancellation mode for performing noise cancellation associated with the on-chip inductor or on-chip switch noise introduced in the LNA.

Figure 1:
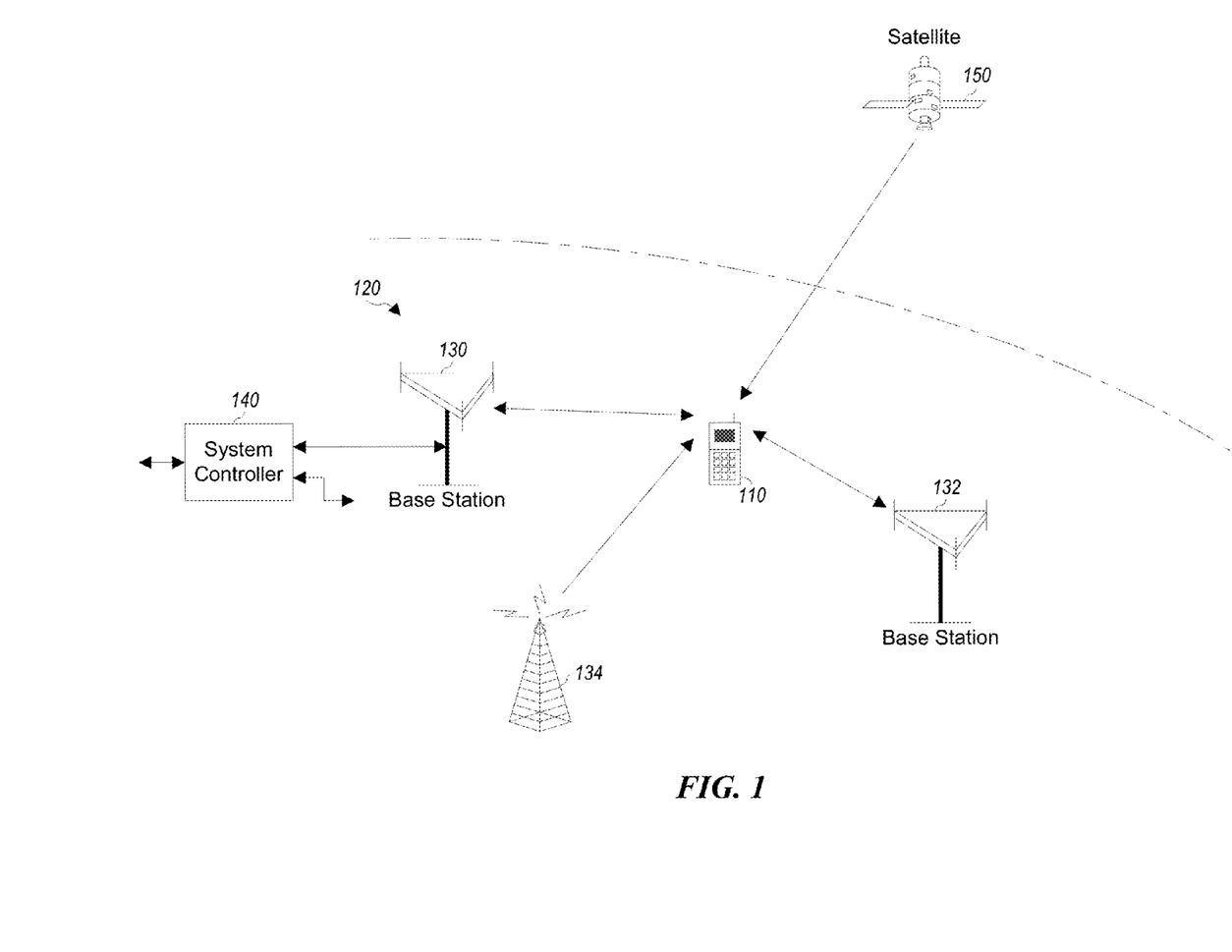
FIG. 1 shows a wireless device communicating with a wireless communication system.

The aspects of the present disclosure may be implemented in the system of FIG. 1. More specifically, aspects of the present disclosure may be implemented in the wireless communication devices of the FIGURES.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
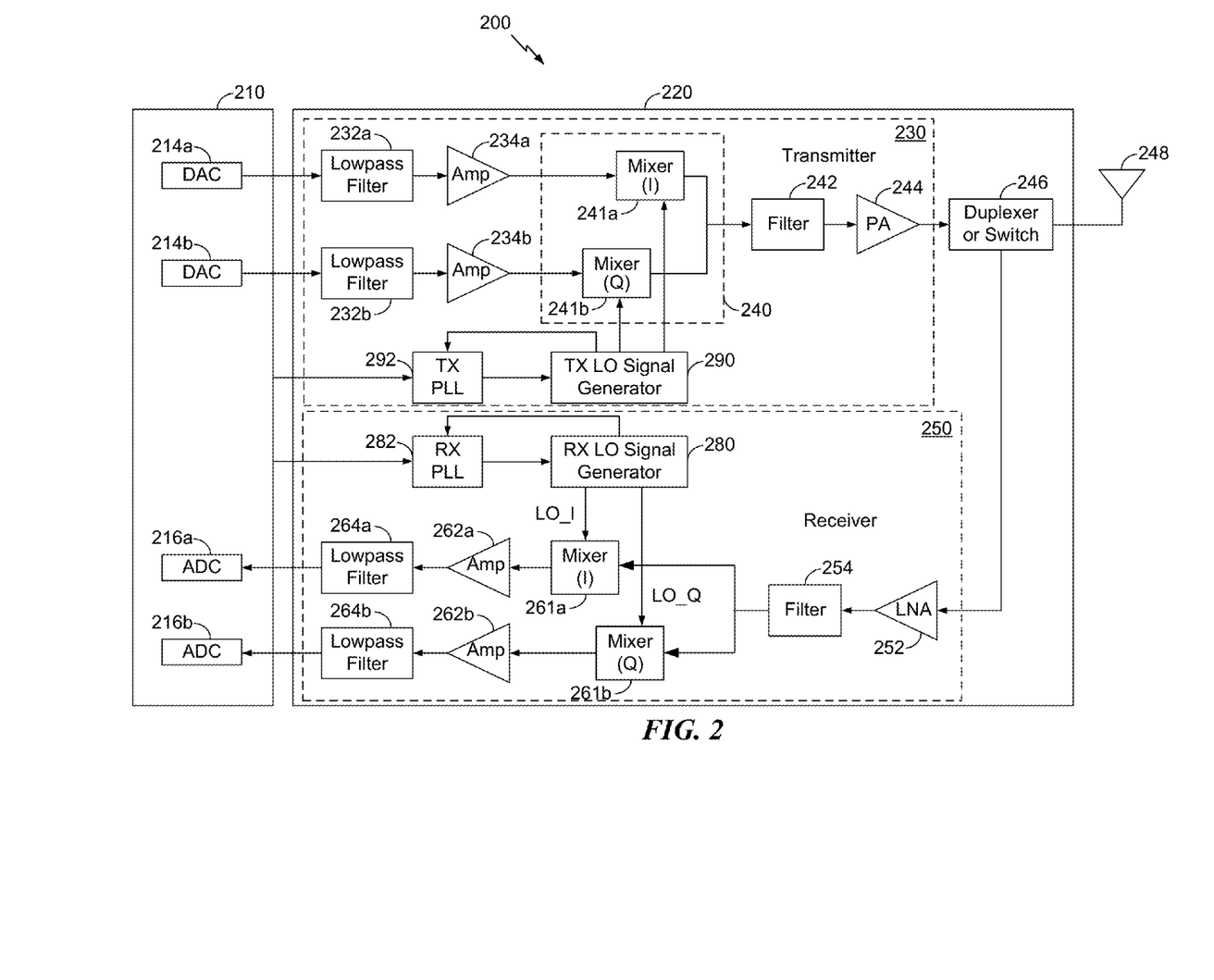
FIG. 2 shows a block diagram of the wireless communication device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 244 may include one or more stages having, for example, driver stages, power amplifier stages, or other components that can be configured to amplify a communication signal on one or more frequencies, in one or more frequency bands, and at one or more power levels. Depending on various factors, the power amplifier can be configured to operate using one or more bias signals.

A bias circuit establishes parameters under which a communication signal is amplified by a power amplifier 244. Correctly biasing the power amplifier 244 is desirable so that the communication signal is appropriately amplified and transmitted to support communication enhancements, such as carrier aggregation. In particular, support for carrier aggregation involves power amplifier operation in both a high power range and a low power range. For example, a high current bias may be specified to enhance linearity for the high power range. To achieve high efficiency over the desired power range, however, a low current bias may be specified for the lower power range.

Figure 3:
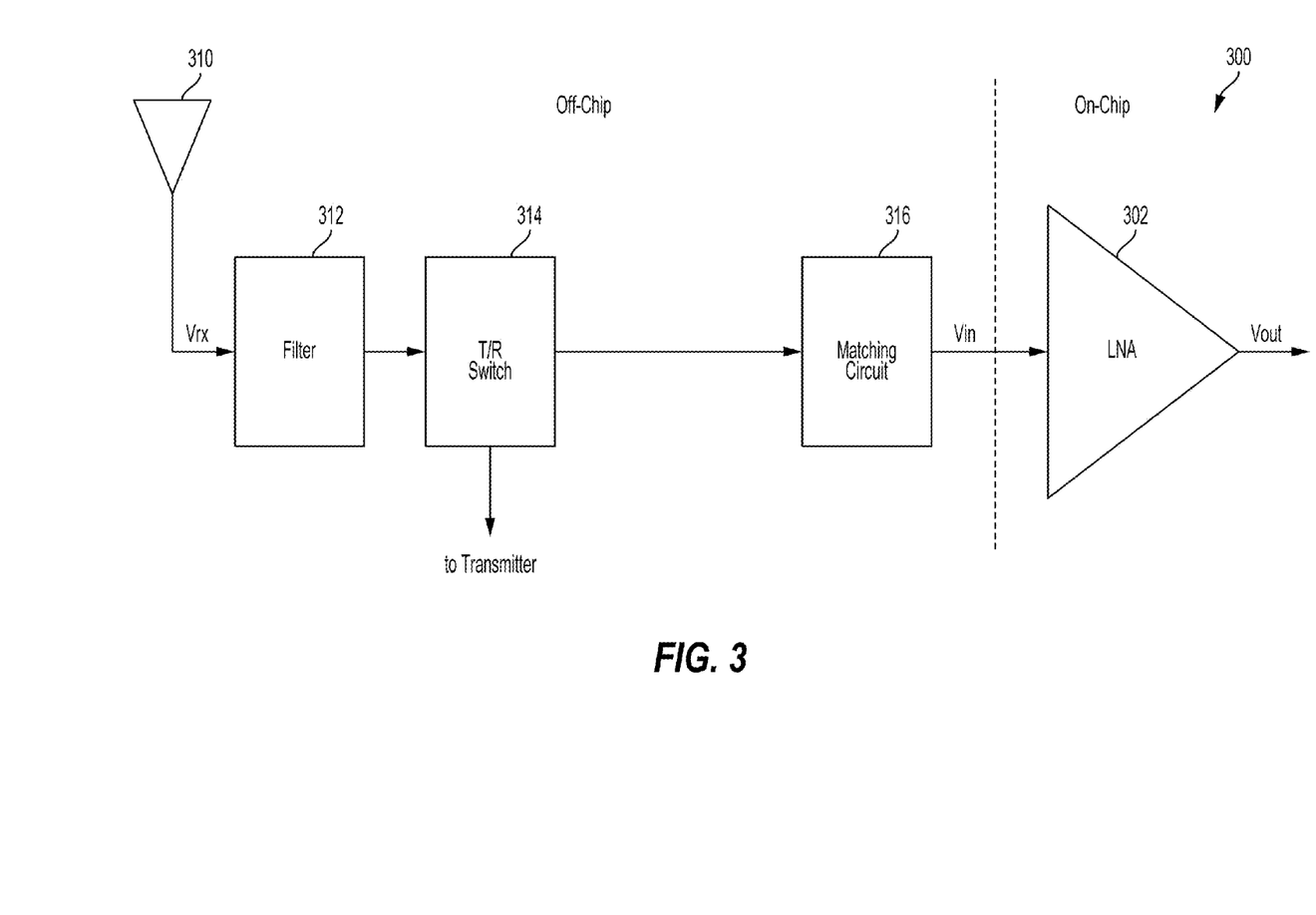
FIG. 3 shows an exemplary design of a front-end of the wireless communication device.

FIG. 3 shows an exemplary design of a front-end of the wireless communication device. The wireless communication device 300 may be a user equipment, a cellular phone, or some other device. The wireless communication device 300 includes a transmitter and a receiver. For simplicity, only a portion of the receiver is shown in FIG. 3, and the transmitter is not shown.

In a receive path, an antenna 310 receives signals transmitted by base stations and/or other transmitter stations and provides a received radio frequency (RF) signal, Vrx. A filter (e.g., bandpass filter) 312 filters the received RF signal to remove out-of-band noise and undesired signals and provides a filtered RF signal. A transmit/receive (T/R) switch 314 connects the receiver or a transmitter to the antenna 310 at any given moment. In a receive mode, the receiver is selected, and the T/R switch 314 routes the filtered RF signal from the filter 312 to a matching circuit 316. In a transmit node, the transmitter is selected, and the T/R switch 314 receives a transmit RF signal from the transmitter and routes the transmit RF signal to the filter 312 for transmission via the antenna 310.

The matching circuit 316 performs input impedance matching for a low noise amplifier (LNA) 302 and provides an input RF signal Vin to the LNA. The matching circuit 316 may be implemented with inductors, capacitors, etc. The LNA 302 amplifies the input RF signal Vin and provides an output RF signal Vout.

The LNA 302 may be implemented on-chip within an integrated circuit (IC), which may be an analog IC, an RF IC (RFIC), a mixed signal IC, etc. The filter 312, the T/R switch 314, and the matching circuit 316 may be implemented off-chip and external to the IC. Some or all of these circuit blocks (e.g., T/R switch 314 and the matching circuit 316) may be implemented with external discrete components, which may then increase the cost and size of wireless device 300.

The filter 312, the T/R switch 314, and matching circuit 316 may be coupled in cascade, as shown in FIG. 3. These circuit blocks may be implemented with passive circuits. Each of these circuit blocks may then have some insertion loss, which may then degrade the noise figure of the receiver.

Aggressive off-chip matching component (e.g., inductor) reduction techniques warrant that next generation LNAs use single inductor (L) matching. However, due to a quality factor (Q-factor) limitation of on-chip inductors (Q~10), the LNA noise figure (NF) becomes very poor. It is difficult or practically impossible to get 1 dB noise figure with an on-chip component that has a low Q-factor. Accordingly, various implementations use an off-chip inductor with a high Q-factor (Q>30) to achieve an acceptable noise figure (~1 dB). The use of the off-chip inductor in this case, however, increases a customer's bill of materials (BOM). To mitigate this issue, some implementations use an additional receive path of the LNA and combine the signals through the different paths at a mixer output, as shown in FIG. 4.

Figure 4:
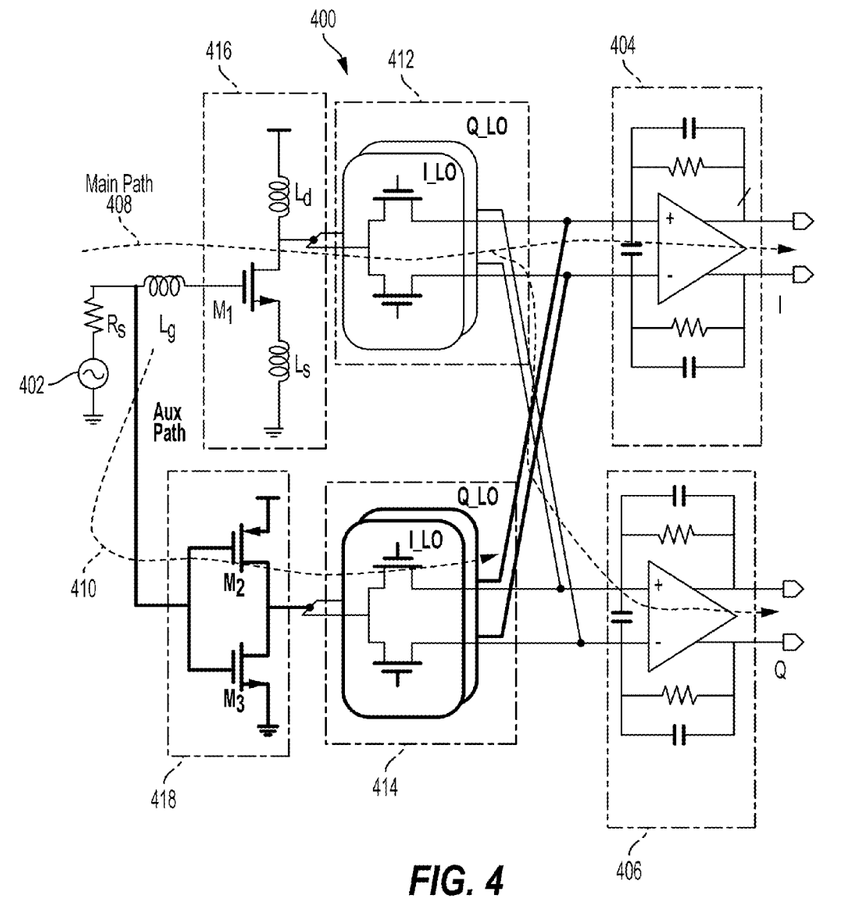
FIG. 4 is a schematic diagram of an exemplary implementation of a noise figure adjustment circuit.

FIG. 4 is a schematic diagram of an exemplary implementation of a noise figure adjustment circuit 400. The noise figure adjustment circuit 400 includes an input signal generator 402 for providing a radio frequency signal to a main path 408 and an auxiliary path 410 for noise cancellation via a resistor $R_S$. The main path 408 includes a main path inductor $L_g$ coupled to a gate of a main transistor $M_1$ of a main low noise amplifier (LNA) stage 416. An inductor $L_d$ of the main LNA stage 416 is coupled to a drain of the main transistor $M_1$ and another inductor $L_s$ is coupled to a source of the transistor $M_1$. The main path 408 also includes a main mixer 412 and main amplifiers 404 and 406 with their surrounding circuitry. The main amplifiers 404 and 406 with their surrounding circuitry may form a base band filter to filter out signals outside of a channel of interest. The surrounding circuitry may include passive components such as capacitors and resistors.

The auxiliary path 410 includes an auxiliary LNA stage 418. The auxiliary LNA stage 418 includes a first auxiliary transistor $M_3$ and a cascode transistor $M_2$. The auxiliary path 410 also includes an auxiliary mixer 414.

The main mixer 412 mixes an output (e.g., differential output) of the main LNA stage 416 with in-phase (I) and quadrature (Q) receive (RX) local oscillator (LO) signals (e.g., I_LO and Q_LO) from a main receive local oscillator (RX LO) signal generator (e.g., RXLO signal generator 280) to generate in-phase (I) and quadrature (Q) baseband signals at an output of the main mixer 412. Similarly, the auxiliary mixer 414 mixes an output of the auxiliary LNA stage 418 with in-phase (I) and quadrature (Q) receive (RX) LO signals (e.g., I_LO and Q_LO) from the main receive local oscillator (RX LO) signal generator to generate in-phase (I) and quadrature (Q) baseband signals at an output of the auxiliary mixer 414.

The outputs (I and Q) of the main mixer 412 and the auxiliary mixer 414 may be combined prior to being received by the main amplifiers 404 and 406. For example, the mixer outputs may be provided to an I-Q combining circuit (not shown) and the outputs of the I-Q combining circuit are provided to the main amplifiers 404 and 406 where the outputs are amplified and filtered.

The noise figure adjustment circuit 400, however, is complicated and consumes an increased amount of power. The noise figure adjustment circuit 400 also performs more local oscillator routings. Moreover, the signal path performance (e.g., two tone transmit signal or second order intercept point (TXIIP2), residual side band (RSB), etc.) of the noise figure adjustment circuit 400 is degraded.

Some aspects of the present disclosure illustrated in the following FIGURES reduce matching and switch noise for a switch LNA design while mitigating cost, area, and process concerns.

Figure 5A:
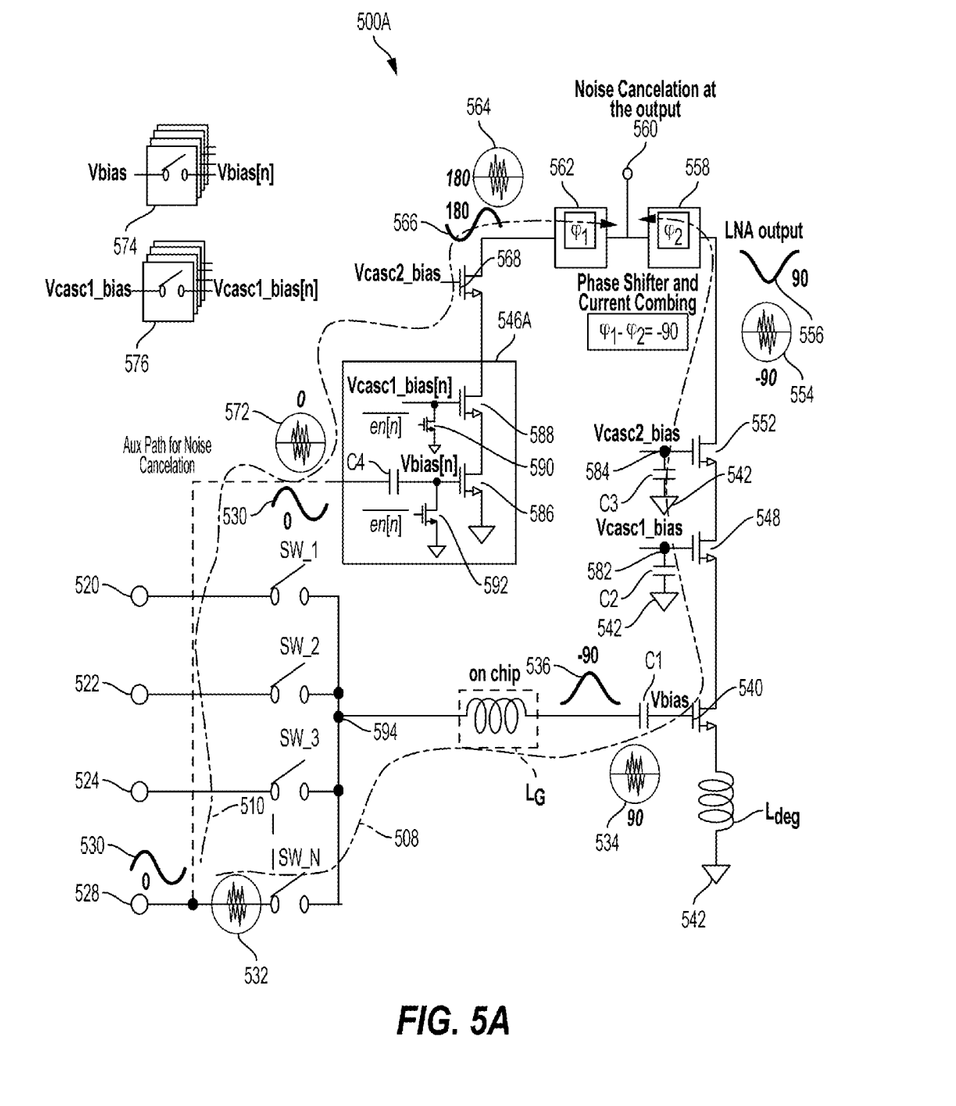
FIGS. 5A, 5B, and 5C each illustrate a switch and matching noise cancelling circuit of a switch low noise amplifier according to aspects of the present disclosure.

FIG. 5A illustrates a switch and matching noise cancelling circuit of a switch low noise amplifier (switch LNA) 500A according to aspects of the present disclosure. The switch LNA 500A includes a main radio frequency signal path 508 and an auxiliary radio frequency signal path 510. An input radio frequency signal 530 from an antenna (e.g., antenna 248 or 310) is received at one or more input terminals 520, 522, 524, and 528 of the switch LNA 500A.

A first noise signal 532 is a total noise model of a switch (e.g., SW_N) and matching components (e.g., inductor $L_G$,) which is in phase with the input radio frequency signal 530. For explanatory purposes, the description uses phases of 0°, +/−90° and +/−180°. However, the aspects of the present disclosure are equally applicable to other phases (e.g., 110°, 115°, etc.) The phase of the first noise signal 532 and the input radio frequency signal 530 changes as the signals traverse the components of the main radio frequency signal path 508 and the auxiliary radio frequency signal path 510.

The main radio frequency signal path 508 includes an input circuit, which includes input terminals 520, 522, 524, and 528 and switches SW_1, SW_2, SW_3, . . . and SW_N. The switches are turned ON (or closed)/OFF (or open) to select a frequency band for receiving the input radio frequency signal 530. In this example, the SW_N may be closed to an ON position to receive the input radio frequency signal 530 while the remaining switches SW_1, SW_2, and SW_3 are opened (or in an OFF position) to prevent reception of signals through the switches SW_1, SW_2, and SW_3 configured for different bands.

The main frequency signal path 508 further includes a main inductor $L_G$ that receives the input radio frequency signal 530 at an output terminal 594 and provides a first output radio frequency signal 536. In some aspects, the main inductor $L_G$ may be an on-chip inductor. Alternatively, the main inductor may be an off-chip inductor. The first output radio frequency signal 536 is subjected to noise while traversing the main radio frequency signal path 508. The noise may be associated with the SW_1, SW_2, SW_3, . . . and SW_N and the main inductor $L_G$. Phase shifting occurs while the input radio frequency signal traverses the different components (e.g., the main inductor $L_G$) along the path (e.g., main radio frequency signal path) of the switch LNA 500A. Because the noise signal is in series with the main frequency signal path 508, the first noise signal 532 has a characteristic 90° (or −270°) phase shift at resonance, whereas the first input signal (e.g., input radio frequency signal 530) has a characteristic −90° phase shift at resonance. Accordingly, the first output radio frequency signal 536 and corresponding first output noise signal 534 are out of phase by 180°. In this portion of the main frequency signal path 508, the first output radio frequency signal 536 has a phase of −90° while the first output noise signal 534 has a phase of 90°.

The main radio frequency signal path 508 further includes a first capacitor (e.g., an alternating current (AC) coupling capacitor) C1, a first transistor 540 and a degeneration inductor $L_{deg}$. The first transistor 540 is the transistor that provides amplification. The degeneration inductor $L_{deg}$ provides source degeneration for the first transistor 540. The first capacitor C1 may be coupled between a gate of the first transistor 540 and an output of the main inductor $L_G$. The degeneration inductor $L_{deg}$ may be coupled between a source of the first transistor 540 and a ground terminal 542.

In addition, the main radio frequency signal path 508 includes a second transistor 548 and a third transistor 552. The second transistor 548 and the third transistor 552 may be cascode transistors that provide better isolation and higher output impedance for higher gain. For example, a drain of the first transistor 540 is coupled to a source of the second transistor 548. A gate of the second transistor 548 receives a control signal (Vcasc2_bias) from a power supply (not shown) via a first control terminal 582.

In one aspect, the power supply source generates a main bias signal (e.g., Vbias or Vcasc_bias illustrated by the circuits 574 and 576) that is provided to transistors based on a selection process. The selection process (e.g., using switches) may be based on whether the cancellation mode is enabled. When the noise cancellation mode is enabled, a bias signal to the transistors may include Vbias(n) or Vcasc1_bias (n). For example, the bias signal for the gain transistors of the switch LNA 500A may be biased by a common bias signal Vbias that is coupled to the respective gain transistors. Similarly, cascode bias signals (e.g., Vcasc1_bias) to the cascode transistors of the switch LNA 500A may be based on a common bias signal Vcasc1_bias that is coupled to the respective cascade transistors based on the band selection of the switches SW_1, SW_2, SW_3, . . . and SW_N of the switch LNA.

A second capacitor C2 is coupled between the first control terminal 582 and a ground terminal 542. The second capacitor C2 may be a filter to reduce unwanted noise, ripple, etc., from the power supply. A drain of the second transistor 548 is coupled to a source of the third transistor 552. A gate of the third transistor 552 receives a control signal (Vcasc2_bias) from the power supply (not shown) via a second control terminal 584. A third capacitor C3 is coupled between the second control terminal 584 and the ground terminal 542. The third capacitor C3 may be a filter to reduce unwanted noise, ripple, etc., from the power supply.

The auxiliary radio frequency signal path 510 may include a first set of transistors 546A and a fourth transistor 568 operated to improve the noise figure of the switch LNA 500A. The first set of transistors 546A are coupled to the fourth transistor 568. The first set of transistors include a fifth transistor 586, a sixth transistor 588, a seventh transistor 590, and an eighth transistor 592. The auxiliary radio frequency signal path 510 also includes a fourth capacitor C4 coupled between the input terminal 528 and a gate of the fifth transistor 586. The fourth capacitor C4 may be an AC coupling capacitor.

The fifth transistor 586 is the transistor that provides amplification (or gain) for the input radio frequency signal 530 when the switch SW_N is closed to select a specific frequency band associated with the switch SW_N, and the fifth transistor 586 and the sixth transistor 588 are enabled in accordance with the noise cancellation mode. The fifth transistor 586 may be enabled by turning off the eighth transistor 592 with a high en[n] voltage and turning on the fifth transistor 586 via the Vbias[n] voltage. The fourth transistor 568 and the sixth transistor 588 may be cascode transistors that provide better isolation and higher output impedance for higher gain. The sixth transistor 588 may be enabled by turning off the seventh transistor 590 with a high en[n] voltage and turning on the sixth transistor 588 via the Vcasc1_bias[n] voltage.

In some aspects of the present disclosure, phase shifters 558 and 562 are respectively introduced into the main radio frequency signal path 508 and the auxiliary radio frequency signal path 510 to improve noise figure of the switch LNA 500A. The noise figure of the switch LNA (and the receiver in general) depends on the phase relationship between the input radio frequency signal and the corresponding noise signal.

For example, a −90° phase shift occurs when the signals traverse the main inductor $L_G$. The phase shift is due to resonant characteristics of a resonator associated with the inductor $L_G$. In this case, a phase of the first output radio frequency signal 536 is −90°, which corresponds to a shift of −90° from the phase (0°) of the input radio frequency signal 530. Similarly, a phase of the first output noise signal 534 is 90°, which corresponds to a shift of 90° from the phase (0°) of the first noise signal 532.

When the signals traverse the first transistor 540 along the main radio frequency signal path 508, the phase of the signals are shifted by 180° in accordance with phase inversion characteristics of the first transistor 540. For example, a phase of the second output radio frequency signal 556 is shifted to 90°, which corresponds to a shift of 180° from the phase (−90°) of the first output radio frequency signal 536. Similarly, a phase of the second output noise signal 554 is shifted to −90°, which corresponds to a shift of 180° from the phase (90°) of the first output noise signal 534.

This out of phase relationship between the radio frequency signal and the noise signal, however, does not exist in the auxiliary radio frequency signal path 510. This follows because the input radio frequency signal 530 and the first noise signal 532 go through the same circuitry along the auxiliary radio frequency signal path 510. In the main radio frequency signal path 508, however, the first noise signal 532 is in series with the input radio frequency signal 530 because the first noise signal is a total noise model of the series components in the main radio frequency signal path 508 (e.g., switches SW_1, SW_2, SW_3, . . . and SW_N, and the main inductor L$_G$). For example, the input radio frequency signal 530 is in phase (at 0°) with a second input noise signal 572 (identical to the first noise signal 532) along the auxiliary radio frequency signal path 510. When the input radio frequency and corresponding noise signals traverse the fifth transistor 586, phase shifting (180°) occurs due to inversion characteristics of the fifth transistor 586. However, the phase relationship between the input radio frequency signals and the corresponding noise signals is maintained. For example, a phase of a third output radio frequency signal 566 at an output of the fifth transistor 586 is shifted to 180°. Similarly, a phase of a third output noise signal 564 at the output of the fifth transistor 586 is shifted to 180°.

The second output radio frequency signal 556 represents an output radio frequency signal generated by the main radio frequency signal path 508 while the second output noise signal 554 represents an output noise signal generated by the main radio frequency signal path 508. The third output radio frequency signal 566 represents an output radio frequency signal generated by the auxiliary radio frequency signal path 510 while the third output noise signal 564 represents an output noise signal generated by the switch SW_N and the main inductor L$_G$ and amplified by the auxiliary radio frequency signal path 510. The signals generated by the main radio frequency signal path 508 and the auxiliary radio frequency signal path 510 have similar amplitudes. For example, two signals can cancel each other out when combined provided the amplitudes are the same and their phases are opposite.

With the output radio frequency signals and the output noise signals of the main radio frequency signal path 508 and the auxiliary radio frequency signal path 510 generated, the output signals are summed to generate an output signal of the switch LNA 500A at an output terminal 560. Because the phase (−90°) of the second output noise signal 554 generated by the main radio frequency signal path 508 and the phase (180°) of the third output noise signal 564 generated by the auxiliary radio frequency signal path 510 are different, a combination of the generated output noise signals 554 and 564 nets a phase difference. As a result, the noise cancellation is incomplete. To make up the difference in phase, the phase shifter 558 and the phase shifter 562 are respectively introduced in the radio frequency signal paths 508 and 510.

For example, combining the phase (180°) of the third output noise signal 564 and the phase (−90°) of the second output noise signal 554 results in a phase difference of 90°. The phase shifters 562 and 558 introduce a −90° phase shift to cancel out the series noise sources of the components (inductor, switch and gate resistance noise of the transistors) of the switch LNA. Another benefit of introducing the −90° phase shift is that the combination of the third output radio frequency signal 566 and the second output radio frequency signal 556 amplifies the radio frequency signal.

The −90° phase shift to cancel out the series noise sources may be introduced by the phase shifters 562 and 558 in accordance with different configurations, as illustrated in Table 1. The phase shifters 562 and 558 may be tunable phase shifters that adjust for phase shifts other than −90°.

TABLE 1

| φ$_1$ | φ$_2$ | Characteristic |
|---|---|---|
| 0 | 90 | High-pass |
| −90 | 0 | Low pass |
| −45 | 45 | All pass (very wideband −90) |

For example, the phase shifter 558 may introduce the entire −90° phase shift in accordance with a high-pass mode. The phase shifter 562 may introduce the entire 90° phase shift in accordance with a low-pass mode. The phase shifter 558 may introduce a portion of the phase shift (e.g., half= −45°) while the other portion (e.g., half=45°) is introduced by the phase shifter 562.

In addition to improving the noise figure, the switch LNA may also improve linearity. The linearity of the LNA has a large influence on both the design of subsequent circuits in the receiver and the receiver performance. The LNA input signal typically includes various undesired signal components that may come from external interfering sources and leakage from a co-located transmitter. The switch LNA may be configured to cancel or remove the undesired signal components to improve the linearity of the switch LNA 500A.

Figure 5B:
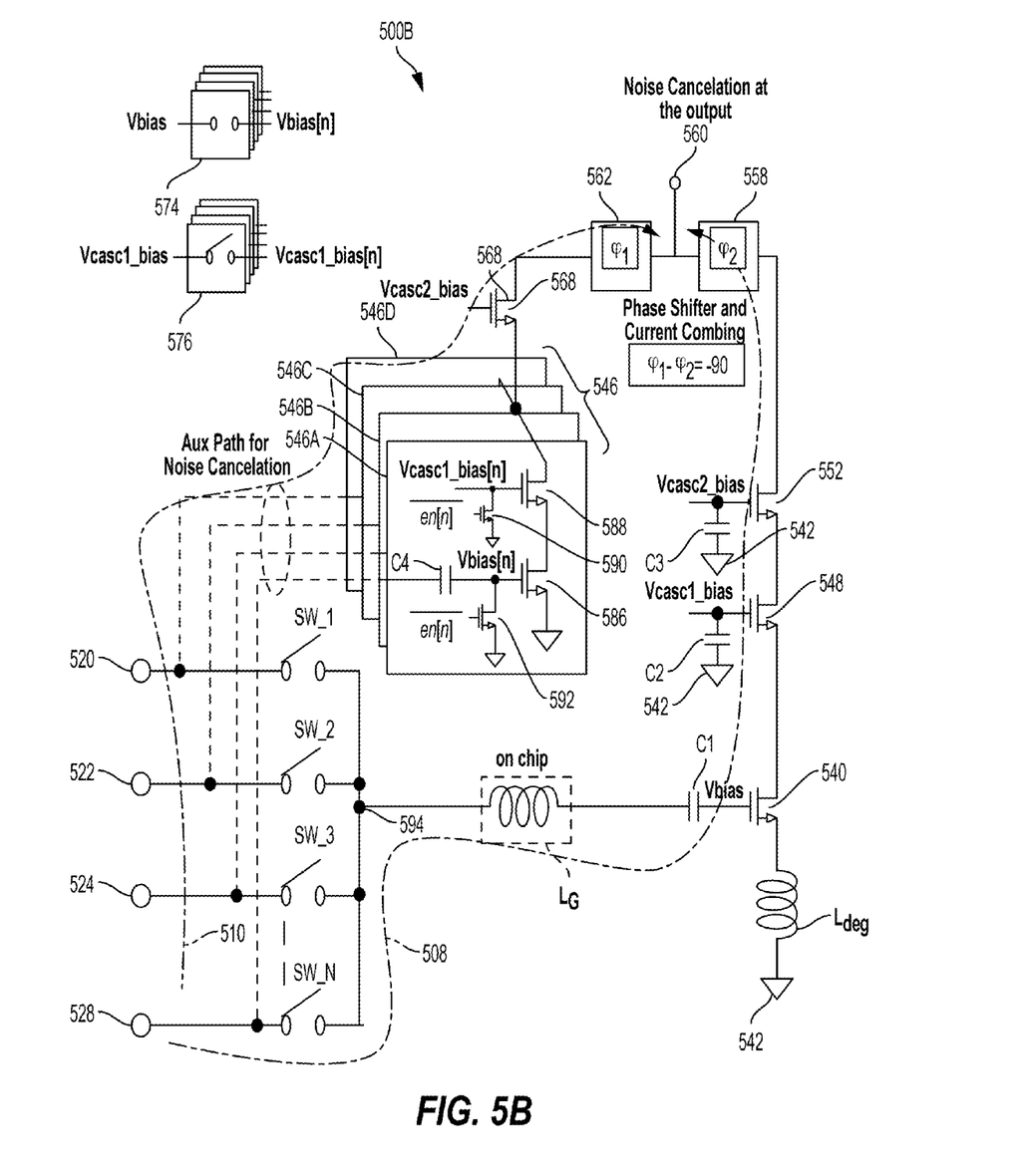

FIG. 5B illustrates another switch and matching noise cancelling circuit of a switch low noise amplifier 500B according to aspects of the present disclosure. For illustrative purposes, some of the labelling and numbering of the devices and features of FIG. 5B are similar to those of FIG. 5A. FIG. 5B introduces a cascade of transistors 546 in the auxiliary radio frequency signal path 510. The cascade of transistors 546 are coupled to the fourth transistor 568. The cascade of transistors 546 include a second set of transistors 546B, a third set of transistors 546C, and a fourth set of transistors 546D in addition to the first set of transistors 546A, described with respect to FIG. 5A. Each of the second set of transistors 546B, the third set of transistors 546C, and the fourth set of transistors 546D are similar to the first set of transistors 546A. Each of the sets of transistors are enabled based on the band selection by the switches SW_1, SW_2, SW_3, . . . and SW_N. For example, the fourth set of transistors 546D may be enabled when a frequency band associated with the switch SW_1 selected and the noise cancellation mode is enabled.

Figure 5C:
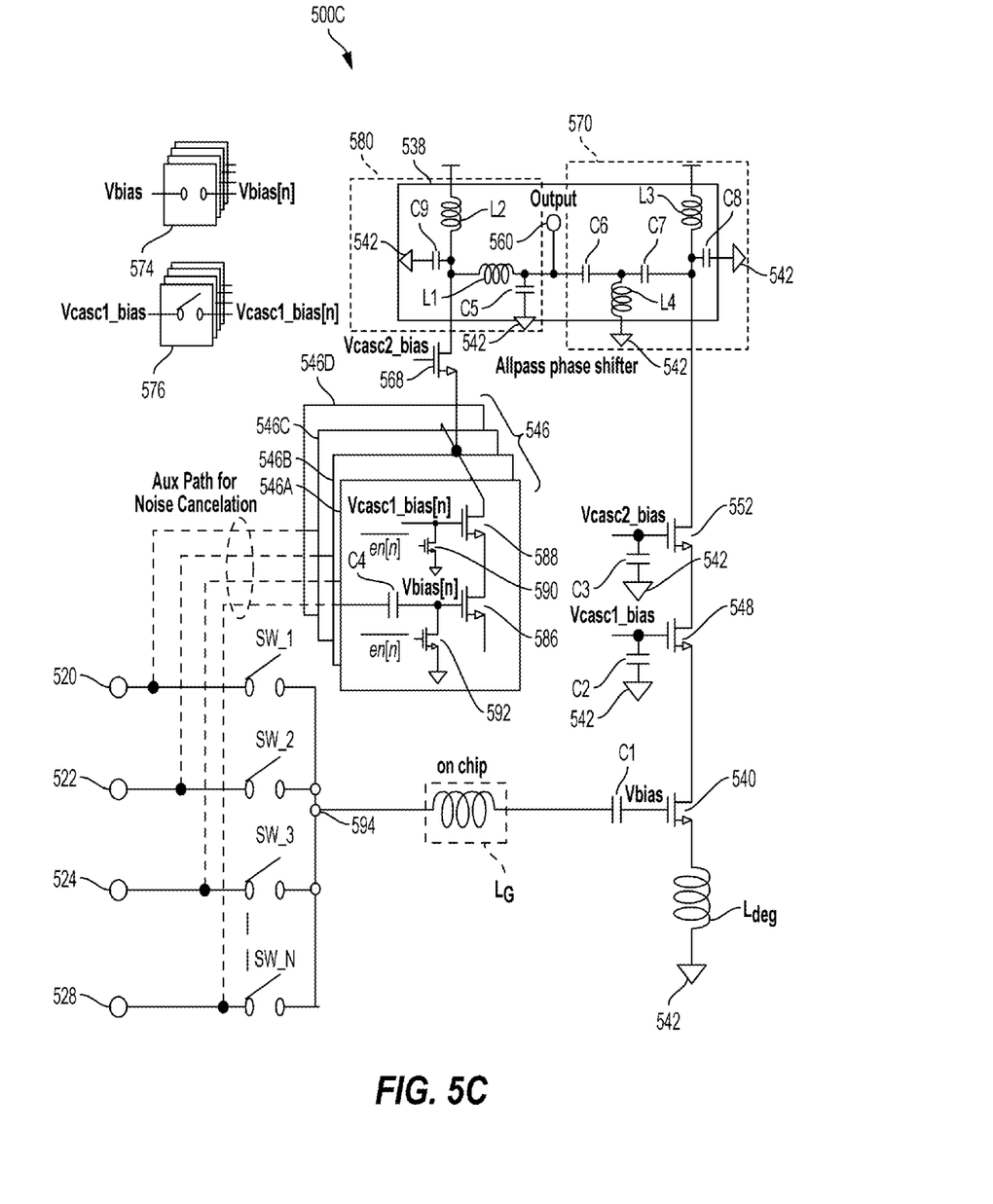

FIG. 5C illustrates another switch and matching noise cancelling circuit of a switch low noise amplifier 500C according to aspects of the present disclosure. For illustrative purposes, some of the labelling and numbering of the devices and features of FIG. 5C are similar to those of FIGS. 5A and 5B. FIG. 5C, however, illustrates an exemplary design for an all-pass phase shifter 538 to the switch LNA. The all-pass phase shifter 538 includes an inductor-capacitor (LC) network. The all-pass phase shifter 538 includes a first phase shift stage 580 (e.g., phase shifter 562) and a second phase shift stage 570 (e.g., phase shifter 558). In some aspects, the phase shifter may be a single device. In other aspects, the phase shifter may be two separate devices along the two paths.

The first phase shift stage 580 includes a first inductor L1, a second inductor L2, a fifth capacitor C5 and a ninth capacitor C9. The ninth capacitor C9 is coupled between the ground terminal 542 and the first and the second inductors. The fifth capacitor is coupled between the ground terminal 542 and the output terminal 560. The second phase shift stage 570 includes a third inductor L3, a fourth inductor L4, a sixth capacitor C6, a seventh capacitor C7, and an eighth capacitor C8. The seventh and eighth capacitors C7 and C8 are coupled to the third inductor L3, the fourth inductor L4 and the sixth capacitor C6. The sixth capacitor is also coupled to the output terminal 560. The eighth capacitor C8 and the fourth inductor L4 are both coupled to the ground terminal 542.

The second inductor L2 and the third inductor L3 provide a DC path to the main radio frequency signal path 508 and the auxiliary radio frequency signal path 510 while maintaining high impedance at high frequencies. The ninth capacitor C9, the first inductor L1, and the fifth capacitor C5 form a pi-network with low-pass filter characteristics with a −45° degree phase shift. The seventh capacitor C7, the fourth inductor L4 and the sixth capacitor C6 form a T-network with high-pass filter characteristics resulting in a 45° degree phase shift. Because the outputs are summed, the filters with low-pass and high characteristics are summed at the output of the switch LNA 500C as well, resulting in an all-pass characteristics with −90° phase shift over very wide range of frequencies.

The following equations illustrate noise factor determination for an inductive degenerative LNA:

$$F = 1 + \frac{\overline{v_g^2}}{\overline{v_s^2}} + \frac{\overline{i_d^2}}{4 v_s^2 G_m^2}$$

After substituting all the values:

$$F = 1 + \frac{R_G}{R_S} + \frac{\left(\frac{\gamma}{\alpha}\right) g_m (2 R_S)^2}{4 R_S} \left(\frac{w_0}{w_t}\right)^2 = 1 + \frac{R_G}{R_S} + \left(\frac{\gamma}{\alpha}\right) g_m R_S \left(\frac{w_0}{w_t}\right)^2$$

For noise cancelling LNA, $$F_{N,C} = 1 + k_1 \frac{\overline{v_g^2}}{\overline{v_s^2}} + \frac{\overline{i_{d,main}^2}}{4 v_s^2 G_{m,t}^2} + \frac{\overline{i_{d,aux}^2}}{v_s^2 G_{m,t}^2}, k_1 < 1$$

$$F_{N,C} = 1 + k_1 \frac{R_G}{R_S} + \frac{\left(\frac{\gamma}{\alpha}\right) g_{m,main}}{4 R_S G_{m,t}^2} + \frac{\left(\frac{\gamma}{\alpha}\right) g_{m,aux}}{R_S G_{m,t}^2}$$

Where $$G_{m,t} = Q g_{m,main} + g_{m,aux} = \left(\frac{w_{t,main}}{w_0}\right) \frac{1}{2 R_S} + g_{m,aux}$$

F is a noise factor;
$v_g^2$ is a low noise amplifier gate noise source represented as a voltage;
$v_s^2$ is an input noise source;
$i_d^2$ is a low noise amplifier drain noise represented as a current;
Gm is the effective transconductance of the low noise amplifier;
$R_G$ is a total gate resistance;
$R_S$ is a total source resistance;
γ is the coefficient of channel thermal noise;
α is the device transconductance over zero-bias drain conductance;
$w_0$ is an angular operating frequency;
$k_1$ is a noise contribution of the series noise sources after cancellation, which is less than 1;
$w_t$ is an angular frequency at which the small signal short circuit current gain of an intrinsic MOS transistor drops to unity;
$g_m$ is a small signal transconductance;
$i_{d,aux}^2$ is channel noise of the auxiliary transistor;
$i_{d,main}^2$ is channel noise on the main transistor;
Gm,t is a total effective transconductance of the LNA;
Q is a quality factor;
$g_{m,aux}$ is a small signal transconductance of an auxiliary transistor;
$g_{m,main}$ is a small signal transconductance of a main transistor; and
$w_{t,main}$ is $w_t$ of a main transistor.

Figure 6:
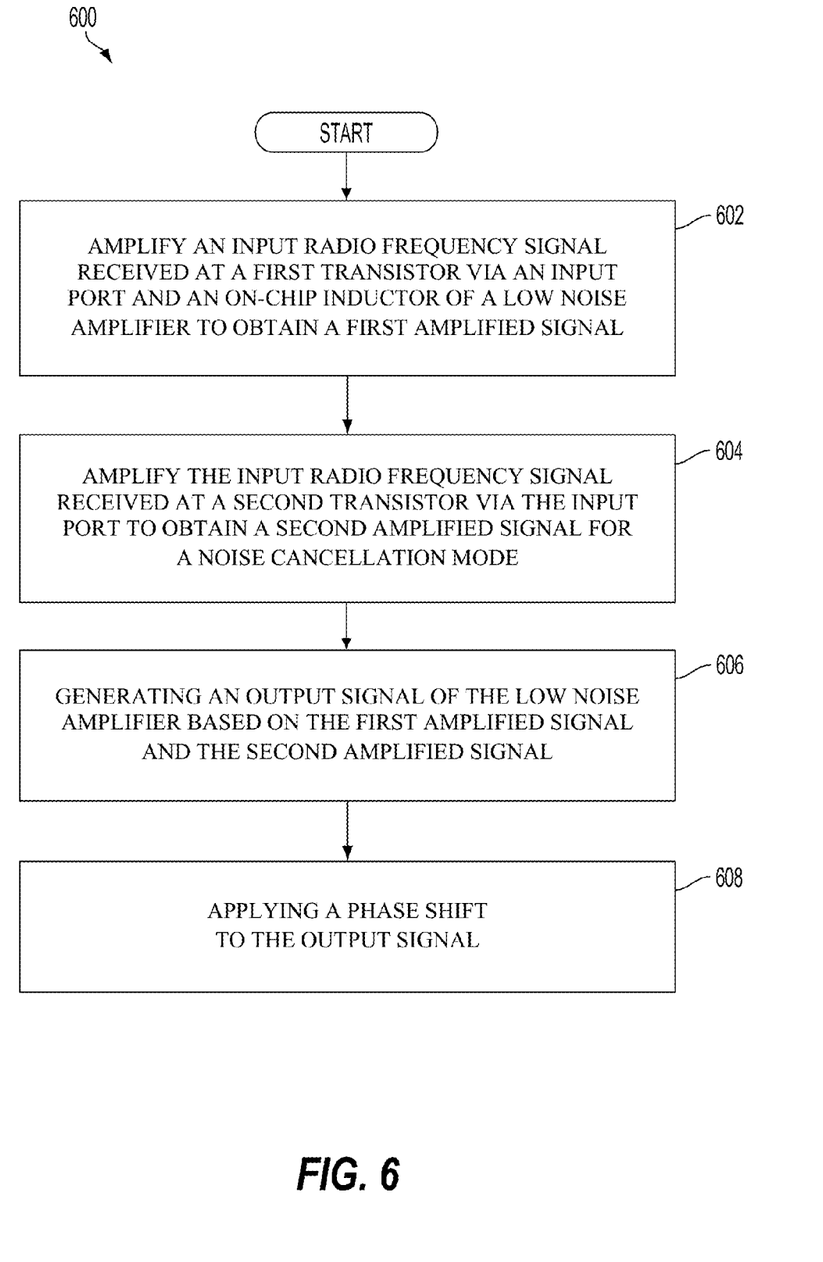
FIG. 6 depicts a simplified flowchart of a method of performing signal amplification in a low noise amplifier (LNA) according to aspects of the disclosure.

FIG. 6 depicts a simplified flowchart 600 of a method for performing signal amplification in a low noise amplifier (LNA) according to one aspect of the disclosure. At block 602, an input radio frequency signal received at a first transistor via an input port and an on-chip inductor of the low noise amplifier is amplified to obtain a first amplified signal. At block 604, the input radio frequency signal received at a second transistor via the input port is amplified to obtain a second amplified signal for a noise cancellation mode. At block 606, an output signal of the low noise amplifier is generated based on the first amplified signal and the second amplified signal. At block 608, a phase shift (e.g., negative ninety degree) is applied to the output signal.

According to a further aspect of the present disclosure, a low noise amplifier is described. The low noise amplifier includes first means for performing signal amplification. The first signal amplification means may be one or more transistors of the low noise amplifier. The low noise amplifier also includes second means for performing signal amplification. The second signal amplification means may be the one or more transistors of the low noise amplifier. In another aspect, the aforementioned means may be any module, or any apparatus configured to perform the functions recited by the aforementioned means.

Figure 7:
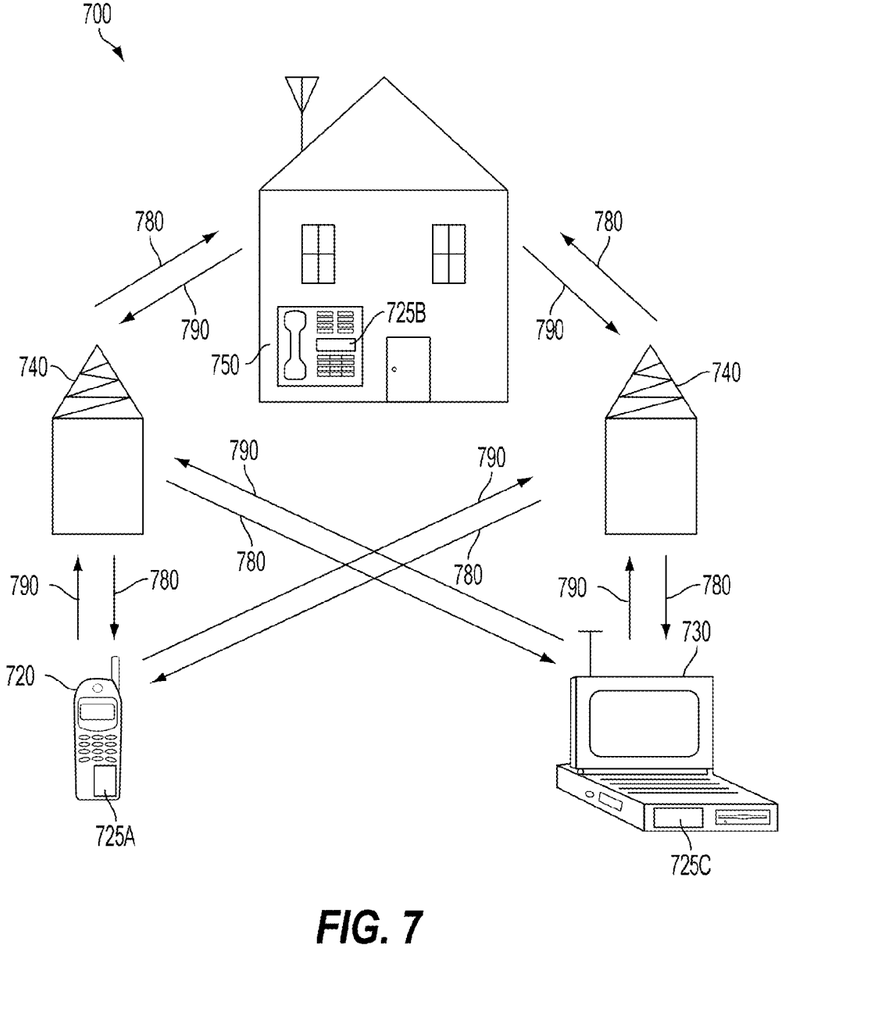
FIG. 7 is a block diagram showing an exemplary wireless communication system in which a configuration of the disclosure may be advantageously employed.

FIG. 7 is a block diagram showing an exemplary wireless communication system in which a configuration of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725B, and 725C that include the disclosed low noise amplifier. It will be recognized that other devices may also include the disclosed low noise amplifier, such as the base stations, switching devices, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the low noise amplifier.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic device, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A low noise amplifier comprising:
    a main radio frequency signal path comprising:
        a first transistor, and
        an inductor between an input port of the low noise amplifier and the first transistor, the first transistor to receive an input radio frequency signal via the inductor and to provide a first amplified signal based at least in part on the input radio frequency signal;
    an auxiliary radio frequency signal path to provide a second amplified signal for a noise cancellation mode based at least in part on the input radio frequency signal; and
    a phase shifter to apply a phase shift to an output signal of the low noise amplifier based at least in part on the first amplified signal and the second amplified signal.

2. The low noise amplifier of claim 1, in which the phase shifter applies the phase shift based at least on an application of a first phase shift and a second phase shift.

3. The low noise amplifier of claim 2, in which a difference between the first phase shift and the second phase shift substantially equals the phase shift.

4. The low noise amplifier of claim 2, in which the first phase shift is different from the second phase shift.

5. The low noise amplifier of claim 1, further comprising at least one switch between the input port and the first transistor, and in which the noise cancellation mode is enabled to cancel noise from the at least one switch and the inductor.

6. The low noise amplifier of claim 1, further comprising a first inductor coupled to a source of the first transistor to provide source degeneration for the first transistor.

7. The low noise amplifier of claim 1, in which the inductor comprises an on-chip inductor.

8. The low noise amplifier of claim 1, in which the phase shifter comprises an inductor-capacitor (LC) network.

9. The low noise amplifier of claim 1, in which the phase shifter comprises one of a tunable phase shifter and at least one tunable capacitor.

10. A method for performing signal amplification in a low noise amplifier, comprising:
    amplifying an input radio frequency signal received at a first transistor via an input port and an inductor of the low noise amplifier to obtain a first amplified signal;
    amplifying the input radio frequency signal received at a second transistor via the input port to obtain a second amplified signal for a noise cancellation mode;
    generating an output signal of the low noise amplifier based at least in part on the first amplified signal and the second amplified signal; and
    applying a phase shift to the output signal.

11. The method of claim 10, in which applying the phase shift comprises applying a first phase shift to the first amplified signal and a second phase shift to the second amplified signal.

12. The method of claim 11, in which a difference between the first phase shift and the second phase shift substantially equals a negative ninety degree phase shift.

13. The method of claim 11, in which the first phase shift is different from the second phase shift.

14. The method of claim 10, further comprising enabling the noise cancellation mode to cancel noise from at least one switch between the input port and the first transistor and noise from the inductor.

15. The method of claim 10, further comprising enabling the second transistor in accordance with the noise cancellation mode.

16. The method of claim 10, further comprising performing noise cancellation in accordance with the phase shift that is applied to the output signal to cancel noise associated with at least one switch between the input port and the first transistor and the inductor.

17. A low noise amplifier comprising:
    a main radio frequency signal path comprising:
        a first means for performing signal amplification, and
        an inductor between an input port of the low noise amplifier and the first signal amplification means, the first signal amplification means for receiving an input radio frequency signal via the inductor and for providing a first amplified signal based at least in part on the input radio frequency signal;
    an auxiliary radio frequency signal path comprising a second means for performing signal amplification for providing a second amplified signal based at least in part on the input radio frequency signal for a noise cancellation mode; and
    a phase shifter to apply a phase shift to an output signal of the low noise amplifier based at least in part on the first amplified signal and the second amplified signal.

18. The low noise amplifier of claim 17, in which the phase shifter applies the phase shift based at least on an application of a first phase shift and a second phase shift.

19. The low noise amplifier of claim 17, further comprising at least one switch between the input port and the first signal amplification means, and in which the noise cancellation mode is enabled to cancel noise from the at least one switch and the inductor.

20. The low noise amplifier of claim 17, in which the second signal amplification means is enabled in accordance with the noise cancellation mode.

21. The low noise amplifier of claim 17, in which the inductor comprises an on-chip inductor.

22. The low noise amplifier of claim 17, in which the phase shifter comprises an inductor-capacitor (LC) network.

23. The low noise amplifier of claim 17, in which the phase shifter comprises one of a tunable phase shifter and at least one tunable capacitor.

\* \* \* \* \*